(12) United States Patent
Koning et al.

(10) Patent No.: US 7,126,215 B2
(45) Date of Patent: Oct. 24, 2006

(54) MICROELECTRONIC PACKAGES INCLUDING NANOCOMPOSITE DIELECTRIC BUILD-UP MATERIALS AND NANOCOMPOSITE SOLDER RESIST

(75) Inventors: Paul A. Koning, Chandler, AZ (US); James Christopher Matayabas, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/815,291

(22) Filed: Mar. 30, 2004

(65) Prior Publication Data

US 2005/0221605 A1    Oct. 6, 2005

(51) Int. Cl.
*H01L 23/053* (2006.01)
*H01L 23/12* (2006.01)
*H01L 23/14* (2006.01)

(52) U.S. Cl. .................. 257/701; 257/700; 257/702; 257/703

(58) Field of Classification Search .............. None
See application file for complete search history.

(56) References Cited

U.S. PATENT DOCUMENTS

| 3,258,387 | A | 6/1966 | Brown et al. |
| 6,653,388 | B1 | 11/2003 | Barbee et al. |
| 2003/0030999 | A1* | 2/2003 | Satsu et al. ........... 361/760 |
| 2004/0025743 | A1* | 2/2004 | Wakizaka et al. ....... 106/18.11 |

FOREIGN PATENT DOCUMENTS

| EP | 0 633 295 A1 | 1/1995 |
| EP | 0 873 047 A2 | 10/1998 |
| EP | 0873047 A2 * | 10/1998 |
| EP | 0 479 729 A1 | 11/2004 |
| EP | 1479729 A1 * | 11/2004 |
| WO | WO 01/40380 A1 | 6/2001 |
| WO | US2005/010209 | 9/2005 |

OTHER PUBLICATIONS

Uhl, F.M. et al., "UV Curable Polymers with Organically Modified Clay as the Nanoreinforcements", Mat. Res. Soc. Symp. Proc. vol. 788 © 2004 Materials Research Society, pp. 203-208.

Alexandre, M. et al., "Polymer-Layered Silicate Nanocomposites: Preparation, Properties and Uses of a New Class of Materials", Materials Science and Engineering, vol. 28, No. 1-2, Jun. 2000, pp. 1-63.

(Continued)

*Primary Examiner*—Luan Thai
(74) *Attorney, Agent, or Firm*—Blakely, Sokoloff, Taylor & Zafman LLP

(57) ABSTRACT

This application discloses an apparatus comprising a substrate including a plurality of conducting layers and a nanocomposite inter-layer dielectric (ILD) sandwiched between the conducting layers, wherein the nanocomposite ILD layer comprises a nanocomposite including a polymer having a plurality of nanoclay particles dispersed therein, the nanoclay particles having a high aspect ratio. Also disclosed is an apparatus comprising a substrate having a contact surface and a nanocomposite solder resist layer placed on the contact surface, wherein the solder resist comprises a nanocomposite including a polymer binder having a plurality of nanoclay particles dispersed therein, the nanoclay particles having a high aspect ratio. Further disclosed is a process comprising providing a plurality of conducting layers and sandwiching a nanocomposite inter-layer dielectric (ILD) between the conducting layers, wherein the nanocomposite ILD layer comprises a nanocomposite including a polymer binder having a plurality of nanoclay particles dispersed therein, the nanoclay particles having a high aspect ratio. Other apparatus and process embodiments are also disclosed and claimed.

31 Claims, 4 Drawing Sheets

OTHER PUBLICATIONS

Yano, K. et al., "Synthesis and Properties of Polyimide-Clay Hybrid Films", Polym Chem, vol. 35, 1997, pp. 2289-2294.

Anonymous, "Radiation Cured Substrate for Circuit Cards", Research Disclosure, Kenneth Mason Publications, vol. 308, No. 54, Dec. 1989.

* cited by examiner

MICROELECTRONIC PACKAGES INCLUDING NANOCOMPOSITE DIELECTRIC BUILD-UP MATERIALS AND NANOCOMPOSITE SOLDER RESIST

TECHNICAL FIELD

The present invention relates generally to semiconductor substrates and solder resists and in particular, but not exclusively, to nanocomposite solder resists and substrates including nanocomposite inter-layer dielectrics.

BACKGROUND

Electronic devices commonly consist of a variety of electronic components formed in or mounted on some sort of substrate. Among other things, the substrate provides a platform to which the components can be mounted and also provides electrical connections between and among the components.

FIG. 1 illustrates an embodiments of a substrate 100. The substrate 100 includes a plurality of conductive layers 102, as well as a plurality of electrically insulating inter-layer dielectric (ILD) layers 104 that separate the conductive layers 102 and electrically insulate them from each other. The substrate 100 is typically built by depositing alternating conductive layers 102 and ILD layers 104 until a substrate is created with the number of layers needed for the required electrical interconnects. The ILD layers 104 are made up of some form of dielectric material. In some embodiments, the material will be some sort of polymer or polymer-based material; the particular material chosen for the dielectric will depend on such factors as the required dielectric constant k, and the physical properties required for manufacturability. Although not shown in FIG. 1, both the conductive layers 102 and ILD layers 104 can have holes of vias therein. When filled with a conducting material, for example, the vias allow electrical connection and communication between different conductive layers within the substrate. Shrinking electronic packages and rising power requirements, along with the advent of ILDs having a low dielectric constant (i.e., low-k ILDs) are forcing dielectric build-up layers 104 to ever-increasing levels of performance.

Over the lifetime of the substrate 100, various factors may contribute to a gradual degradation of the substrate or its individual layers. One important factor that degrades the performance of the ILD layers 104 is the migration into and through the ILD's dielectric material of ions and molecules—most notably, but not exclusively, water, oxygen, halogen ions and metal ions. These molecules may originate from environmental sources outside the substrate 100, as shown by arrows 106. Molecules and ions, in particular metal ions, may also originate from within the conductive layers 102, or along the interface between a conductive layer 102 and an ILD layer 104 as shown by arrows 108. Finally, molecules and ions may originate from within the ILD layer 104 itself: halogen ions and oxygen, for instance, may be released from the ILD material by a process known as "outgassing." Although in FIG. 1 the arrows 108 and 110 only illustrate migration of molecules and ions in one direction, the molecules and ions may migrate into and through the ILD in the opposite direction as well.

FIG. 2 illustrates an embodiment 200 of the attachment of an electronic device to a substrate. A die 202 is attached to a substrate 204 using a plurality of solder balls 206. In addition to anchoring the die 202 to the substrate, the solder balls 206 provide an electrical connection to an underlying conductive layer 212 within the substrate. In assemblies such as the one shown, it is common to put a layer of solder resist 208 on the surface of the substrate before attaching the die 202 using the solder balls 206. As its name implies, the purpose of the solder resist is to resist the solder; among other things, the solder resist prevents the solder from flowing onto and into portions of the substrate where it is not wanted, and prevents electrical connection between the solder balls and other areas of the substrate. The solder resist layer 208, like the ILD layers 210 within the substrate, can be made of a dielectric material and it therefore suffers from degradation over time due to the same molecular and ionic migration problem that the ILDs suffer from—namely, the migration of ions and molecules such as water, oxygen, halogen ions and metal ions. As with the ILDs, the ions or molecules entering into or migrating through the ILD can originate externally, such as from the environment or from adjacent layers of the substrate, or can be internal, by processes such as outgassing.

Current solutions used to reduce molecular and ionic migration through ILD and solder resist layers center around chemical modification of the ILD or solder resist polymer, for example by using more hydrolytically and oxidatively stable monomers, etc. Often silica is added to toughen the polymer and lower the coefficient of thermal expansion (CTE) of a solder resist layer. None of these solutions, however, substantially slow or stop the migration of ions and molecules through the material and, consequently, do little to counter the degradation that occurs over time because of these ionic and molecular migrations.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified. The figures are not to scale unless so noted, and are not intended to illustrate the exact sizes, absolute or relative, of the structure shown therein or any component thereof.

DETAILED DESCRIPTION OF THE ILLUSTRATED EMBODIMENTS

Embodiments of substrates including nanocomposite dielectric layers and of nanocomposite solder resists are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 3:
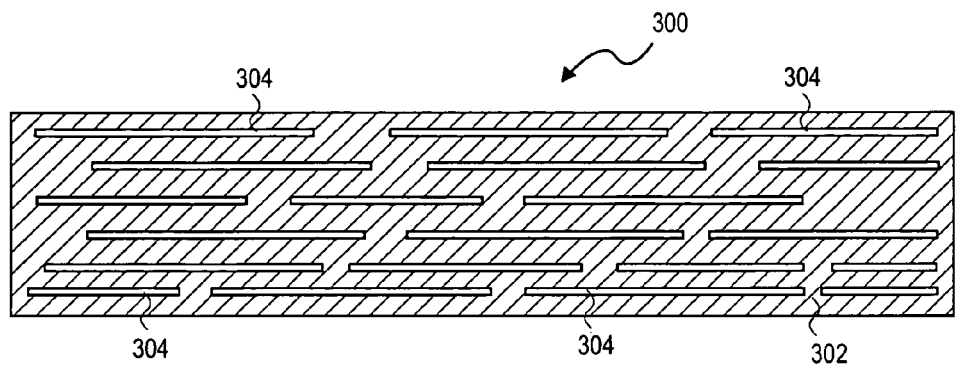
FIG. 3 is a side elevation of an embodiment of a nanocomposite dielectric that can be used as an inter-layer dielectric (ILD) in an embodiment of a substrate such as shown in FIG. 1 or an embodiment of a solder resist layer such as shown in FIG. 2.

FIG. 3 illustrates a nanocomposite 300 that can be used as an inter-layer dielectric (ILD) or a solder resist layer. The nanocomposite 300 comprises a polymer binder 302 within which are embedded a plurality of nanoclay particles 304, such as platelets or tactoids of a nanoclay material. In one embodiment, the platelets or tactoids 304 have an aspect ratio (i.e., the platelet's diameter divided by its thickness) greater than 200, while in other embodiments the platelets 304 can have aspect ratios as low as 50. The platelets or tactoids also preferably have a high surface area. The nanocomposites, by virtue of the platelet particles, have improved reliability performance, all of which have their origins in slowing the diffusion processes for water, oxygen halogen ion and metal ions.

In one embodiment, the nanocomposite formulation comprises less than about 25 weight percent of nanoclay platelet particles, but in other embodiments less than about 10 weight percent of clay platelet particles. In still other embodiments, the nanocomposite may contain less that 5 percent by weight of platelet particle, or in some cases less that ½ percent by weight of platelet particles. Preferably, the nanoclay particles 304 are dispersed in the polymer binder so that most of the clay particles exist as individual platelets, small tactoids, and small aggregates of tactoids with dimension of less than about 20 nm. Compositions with a greater proportion of individual platelet particles and fewer tactoids or aggregates are preferred. In some embodiments of the nanocomposite 300, the platelets or tactoids 304 will be uniformly distributed within the polymer binder, but in other embodiments it may be desirable to have different amounts of platelets or tactoids in different areas of the layer 300. Also, although in embodiment shown in the figure all the nanoclay particles 304 have the same orientation, in other embodiments the nanoclay particles may have different orientations.

The composition of the polymer binder 302 used for the nanocomposite 300 will depend on whether the nanocomposite 300 will be used as an ILD layer or a solder resist layer. Whether used as an ILD layer or a solder resist layer, the polymer binder 302 can have various compositions, depending on its performance requirements (e.g., physical properties such as viscosity, strength, and hardness, and electrical properties such as the dielectric constant k). Table 1 indicates the composition of an embodiment of the polymer binder 302 for a thermally-curable inter-layer dielectric; the exact chemicals and compounds used for each component of the binder are known to those of skill in the art. Of course, in other embodiments of the polymer binder more, less or different components than those shown in Table 1 can be used. For example, other polymer resins such as polyesters, polyetheresters, polyamides, polyesteramides, polyurethanes, polyimides, polyetherimides, polyureas, polyamide-imides, polyphenyleneoxides, phenoxy resins, epoxy resins, polyolefins, polyacrylates, polystyrenes, polyethylene-co-vinyl alcohols (EVOH), and the like or their combinations and blends can be used. Other polymers not listed here and their combinations or blends can also be used.

TABLE 1

Embodiment of a Thermally Curable Inter-Layer Dielectric (ILD)

Epoxy resins
Phenolic hardeners
Catalyst (amine, anhydride or imidazole type catalyst)
Silica Fillers
Rubber Impact Modifiers
Solvents to facilitate blending and conversion to a thin film
Optionally, Thixotropic agent for viscosity control (for example, fumed silica)
Optionally, foaming inhibitors
Optionally, Pigments or dye
Optionally, flame retardants Table 2 indicates the composition of an embodiment of a polymer binder 302 for thermally-curable solder resist layer; the exact chemicals and compounds used for each component are known to those of skill in the art. Of course, in other embodiments of the binder more, less or different components can be used. For example, other polymer resins besides epoxy can be used, as discussed above in connection with Table 1.

TABLE 2

Embodiment of a Thermally Curable Solder Resist

Epoxy resins
Phenolic hardeners
Catalyst (amine, anhydride or imidazole type catalyst)
Solvents to facilitate blending and conversion to a thin film
Optionally, thixotropic agent for viscosity control (for example, fumed silica)
Optionally, foaming inhibitors
Optionally, pigments or dye
Optionally, flame retardants Table 3 indicates the composition of an embodiment of a polymer binder for photo-curable solder resist layer; the exact chemicals and compounds used for each component are known to those of skill in the art. Of course, in other embodiments of the binder more, less or different components can be used. For example, other polymer resins besides acrylate can be used, as discussed above in connection with Table 1.

TABLE 3

Embodiment of a Photo-Curable Solder Resist

Figures 4A, 4B:
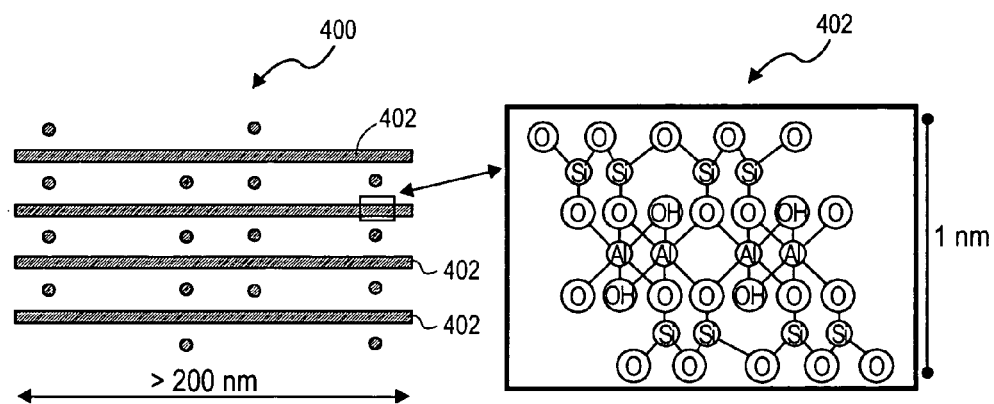
FIG. 4A is an enlarged side elevation of an embodiment of a tactoid structure within a nanoclay.
FIG. 4B is a diagram illustrating the chemical composition of a platelet within a tactoid structure as shown in FIG. 4A.

Acrylate resin (such as Tris(hydroxyethyl) isocyanurate diacrylate)
Photoactive catalyst
Solvents to facilitate blending and conversion to a thin film
Optionally, thixotropic agent for viscosity control (for example, TABLE 3-continued Embodiment of a Photo-Curable Solder Resist fumed silica)
Optionally, foaming inhibitors
Optionally, pigments or dye
Optionally, flame retardants FIGS. 4A and 4B illustrate an embodiment of the structure of clay materials suitable for obtaining the nanoclay particles 304 to be mixed with the polymer binder 302 to obtain the nanocomposite. FIG. 4A shows a tactoid 400, which comprises an agglomeration of individual platelets 402 that are closely stacked together like cards. The individual platelets 402 preferably have a thickness less than about 2 nm and a diameter greater than about 10 nm, typically between about 10 nm and about 3000 nm. In addition to having the platelet structure shown in the figure, the layered clay materials are typically swellable free flowing powders having a cation exchange capacity from about 0.3 to about 3.0 milliequivalents per gram of mineral (meq/g), preferably from about 0.90 to about 1.5 meq/g. FIG. 4B illustrates the chemical composition and structure of a talc platelet 402 that has been exfoliated from the tactoid 400.

Clay materials useful in various embodiments of the invention include natural clays, synthetic clays, and modified phyllosilicates. Natural clays include smectite clays, such as montmorillonite, saponite, hectorite, mica, vermiculite, bentonite, nontronite, beidellite, volkonskoite, magadite, kenyaite, and the like. Synthetic clays include synthetic mica, synthetic saponite, synthetic hectorite, and the like. Modified clays include fluorinated montmorillonite, fluorinated mica, and the like. Combinations or blends of these clay materials can also be used, as can other clay materials not listed here and combinations or blends thereof.

Once the appropriate polymer binder and nanoclay materials have been selected, they must be combined to make the nanocomposite ILD or solder resist. In one embodiment, the polymer binder and the nanoclay are combined by exfoliating platelets or tactoids from the selected nanoclay into the polymer binder. Before the polymer binder and the nanoclay can be mixed to form the nanocomposite ILD layer or solder resist layer, the particle size of the clay material is reduced in size by methods known in the art, including, but not limited to, grinding, pulverizing, hammer milling, jet milling, and their combinations. The average particle size is preferably reduced to less than 100 micron in diameter, more preferably to less than 50 micron in diameter, and most preferably to less than 20 micron in diameter.

After the particle size is reduced, the nanoclay may be further treated to aid exfoliation in the composite and/or improve the strength of the polymer binder/clay interface. Examples of useful treatments include intercalation with water-soluble or water-insoluble polymers, organic reagents or monomers, silane compounds, metals or organometallics, and/or their combinations. Intercalation involves chemically inserting an intercalant, which in one embodiment is an organic cation, between adjacent platelet particles or tactoids of the layered material to increase the interlayer spacing between the adjacent platelets and tactoids, making it easier to exfoliate the individual platelets from the material. In an embodiment of this invention, an intercalated layered clay material is prepared by the reaction of a swellable layered clay with one or more organic cations, preferably ammonium compounds, to effect partial or complete cation exchange. Numerous methods to modify layered clays with organic cations are known, and any of these may be used in the practice of this invention. One embodiment of this invention is the organic modification of a layered clay with an organic cation salt by the process of dispersing a layered clay or mixture of clays into hot water (50 to 80° C.), adding the organic cation salt (neat or dissolved in water or alcohol) with agitation, then blending for a period of time sufficient for the organic cations to exchange most of the metal cations present in the galleries between the layers of the clay material(s). Then, the organically modified layered clay material(s) is isolated by methods known in the art including, filtration, centrifugation, spray drying, and their combinations.

After the nanoclay material is prepared for exfoliation, it must be mixed with the polymer binder to form the nanocomposite 300. In one embodiment, the layered clay material mixture is incorporated with the polymer binder by melt processing the polymer binder and the layered clay material mixture. In other embodiments, other methods known in the art can be used for mixing. After the nanocomposite 300 is mixed, it can be cast into films or otherwise formed into ILD layers or solder resist layers, as the case may be, by a wide variety of process known in the art.

Figure 1:
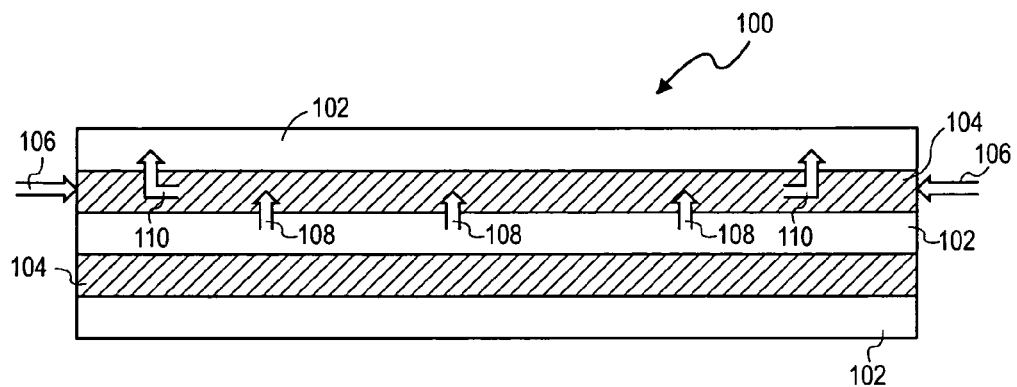
FIG. 1 is a side elevation of an embodiment of a substrate.
Figure 5:
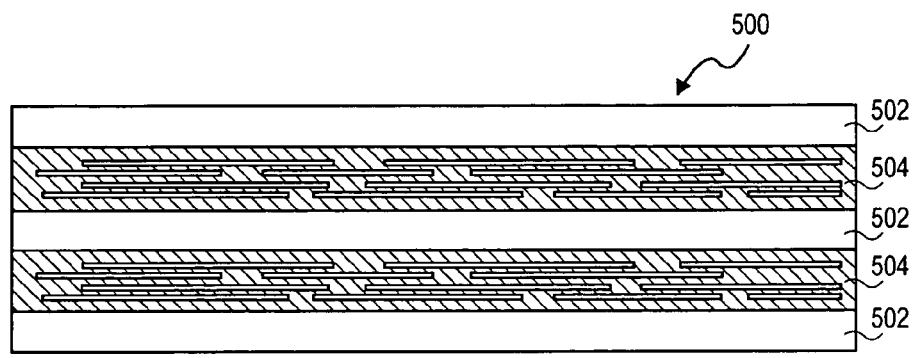
FIG. 5 is a side elevation of an embodiment of a substrate including a nanocomposite inter-layer dielectric (ILD) as shown in FIG. 3.

FIG. 5 illustrates an embodiment of a substrate 500 including a plurality of conductive layers 502 separated by nanocomposite ILD layers 504. As with the substrate 100 (see FIG. 1), the nanocomposite layers 504 separate the conductive layers 502 and electrically insulate them from each other. Unlike the substrate 100, the platelets or tactoids within nanocomposite ILD layers 504 also slow or prevent migration or molecules and ions into and through the ILD layer, thus slowing or preventing the undesirable effects that these molecular and ionic migrations have on the substrate over time. The end result is a more robust, high performance ILD layer and a more robust package.

Figure 2:
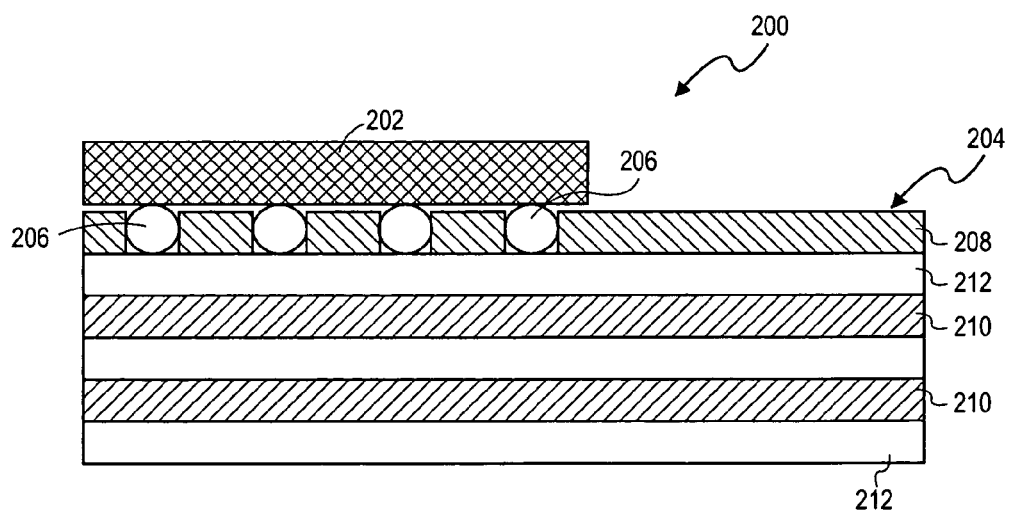
FIG. 2 is a side elevation of an embodiment of a die mounted on a substrate such as the substrate shown in FIG. 1.
Figure 6:
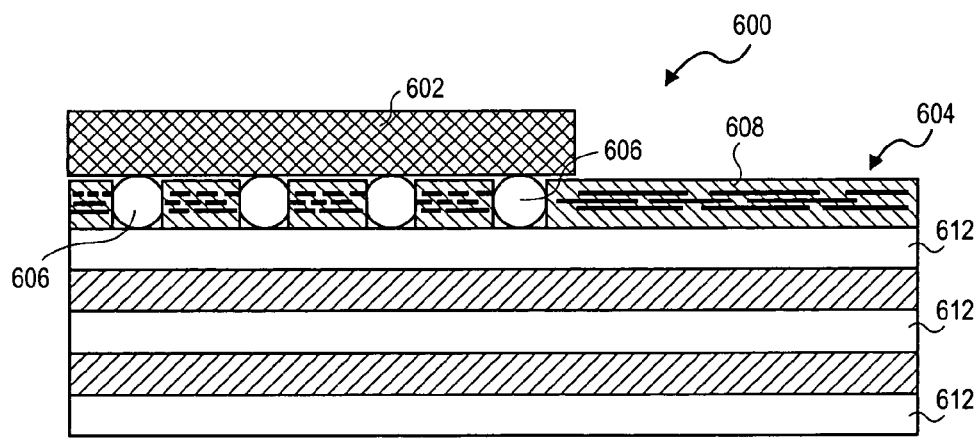
FIG. 6 is a side elevation of an embodiment of a die mounted on a substrate such as the substrate shown in FIG. 1 using a nanocomposite solder resist layer as shown in FIG. 3.

FIG. 6 illustrates an embodiment 600 of the attachment of an electronic device to a substrate. A die 602 is attached to a substrate 604 using a plurality of solder balls 606. In addition to anchoring the die 602 to the substrate, the solder balls 606 provide an electrical connection to an underlying conductive layer 612 within the substrate. A layer of nanocomposite solder resist layer 608 is applied to the surface of the substrate before attaching the die 602 using the solder balls 606. In contrast with the solder resist layer 208 (see FIG. 2), the solder resist layer 608 in this embodiment is a nanocomposite that slows or halts molecular and ionic migrations and their detrimental results. The end result is a more robust, high performance solder resist layer and a more robust package.

Figure 7:
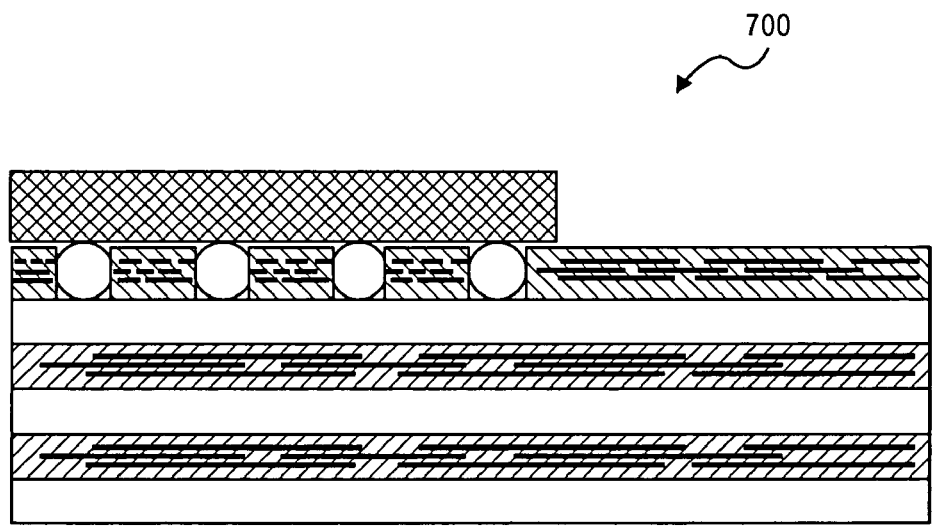
FIG. 7 is a side elevation of an embodiment of a die mounted on a substrate such as the substrate shown in FIG. 1 using a nanocomposite inter-layer dielectric (ILD) and a nanocomposite solder resist layer as shown in FIG. 3.

FIG. 7 illustrates another embodiment 700 of the attachment of an electronic component to a substrate. The embodiment 700 shown in FIG. 7 is similar to the embodiment 600 shown in FIG. 6, the principal difference being that the embodiment shown in FIG. 7 includes both a substrate having nanocomposite ILD layers and a nanocomposite solder resist layer. Uses of nanocomposite ILD layers and a nanocomposite solder resist layers are not mutually exclusive, and both can be used in a single assembly or device.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
a substrate including a plurality of conducting layers; and
a nanocomposite inter-layer dielectric (ILD) sandwiched between the conducting layers, wherein the nanocomposite ILD layer comprises a nanocomposite including a polymer having a plurality of nanoclay platelets dispersed therein, the nanoclay platelets having an aspect ratio equal to or greater than about 50.

2. The apparatus of claim 1 wherein the nanoclay platelets have an aspect ratio greater than about 200.

3. The apparatus of claim 1 wherein the nanoclay platelets are grouped into tactoids.

4. The apparatus of claim 1 wherein the nanocomposite comprises less than 25 percent by weight of nanoclay.

5. The apparatus of claim 4 wherein the nanocomposite comprises less than 10 percent by weight of nanoclay.

6. The apparatus of claim 5 wherein the nanocomposite comprises less than 5 percent by weight of nanoclay.

7. The apparatus of claim 6 wherein the nanocomposite comprises less than ½ percent by weight of nanoclay.

8. The apparatus of claim 1 wherein the nanoclay comprises natural clays, synthetic clays, modified phyllosilicates, or combinations or blends thereof.

9. The apparatus of claim 1 wherein the polymer binder comprises a thermally curable polymer.

10. An apparatus comprising:
a substrate having a contact surface; and
a nanocomposite solder resist layer placed on the contact surface, wherein the solder resist comprises a nanocomposite including a polymer binder having a plurality of nanoclay platelets dispersed therein, the nanoclay platelets having an aspect ratio equal to or greater than about 50.

11. The apparatus of claim 10 wherein the nanoclay platelets have an aspect ratio greater than about 200.

12. The apparatus of claim 10 wherein the nanoclay platelets are grouped into tactoids.

13. The apparatus of claim 10 wherein the nanocomposite comprises less than 25 percent by weight of nanoclay.

14. The apparatus of claim 13 wherein the nanocomposite comprises less than 10 percent by weight of nanoclay.

15. The apparatus of claim 14 wherein the nanocomposite comprises less than 5 percent by weight of nanoclay.

16. The apparatus of claim 15 wherein the nanocomposite comprises less than ½ percent by weight of nanoclay.

17. The apparatus of claim 10 wherein the nanoclay comprises natural clays, synthetic clays, modified phyllosilicates, or combinations or blends thereof.

18. The apparatus of claim 10 wherein the polymer binder comprises a thermally curable polymer.

19. The apparatus of claim 10 wherein the polymer binder comprises a photo-curable polymer.

20. The apparatus of claim 10 wherein the substrate comprises:
a plurality of conducting layers; and
a nanocomposite inter-layer dielectric (ILD) sandwiched between the conducting layers, wherein the nanocomposite ILD layer includes a nanocomposite comprising a polymer binder having a plurality of nanoclay platelets dispersed therein, the nanoclay platelets having an aspect ratio equal to or greater than about 50.

21. A system comprising:
a substrate having a contact surface;
a nanocomposite solder resist layer placed on the contact surface, wherein the solder resist comprises a nanocomposite including a polymer binder having a plurality of nanoclay platelets dispersed therein, the nanoclay platelets having an aspect ratio equal to or greater than about 50; and
a die attached to and in electrical contact with the contact surface, the die being attached using solder deposited in holes in the nanocomposite solder resist layer.

22. The system of claim 21 wherein the nanoclay platelets have an aspect ratio greater than about 200.

23. The system of claim 21 wherein the nanoclay platelets are grouped into tactoids.

24. The system of claim 21 wherein the nanocomposite comprises less than 25 percent by weight of nanoclay.

25. The system of claim 24 wherein the nanocomposite comprises less than 10 percent by weight of nanoclay.

26. The system of claim 25 wherein the nanocomposite comprises less than 5 percent by weight of nanoclay.

27. The system of claim 26 wherein the nanocomposite comprises less than ½ percent by weight of nanoclay.

28. The system of claim 21 wherein the nanoclay comprises natural clays, synthetic clays, modified phyllosilicates, or combinations or blends thereof.

29. The system of claim 21 wherein the polymer binder comprises a thermally curable polymer.

30. The system of claim 21 wherein the polymer binder comprises a photo-curable polymer.

31. The system of claim 21 wherein the substrate comprises:
a plurality of conducting layers; and
a nanocomposite inter-layer dielectric (ILD) sandwiched between the conducting layers, wherein the nanocomposite ILD layer includes a nanocomposite comprising a polymer binder having a plurality of nanoclay platelets dispersed therein, the nanoclay platelets having an aspect ratio equal to or greater than about 50.

* * * * *